(12) United States Patent  
Melanson

(10) Patent No.: US 6,344,811 B1
(45) Date of Patent: Feb. 5, 2002

(54) POWER SUPPLY COMPENSATION FOR NOISE SHAPED, DIGITAL AMPLIFIERS

(75) Inventor: John Laurence Melanson, Austin, TX (US)

(73) Assignee: Audio Logic, Inc., Boulder, CO (US)

( * ) Notice: Subject to any disclaimer, the term of this patent is extended or adjusted under 35 U.S.C. 154(b) by 0 days.

(21) Appl. No.: 09/526,784

(22) Filed: Mar. 16, 2000

Related U.S. Application Data

(60) Provisional application No. 60/124,584, filed on Mar. 16, 1999.

(51) Int. Cl.[7] .................................................. H03M 3/00
(52) U.S. Cl. ...................................................... 341/143
(58) Field of Search ................................ 341/143, 155, 341/110, 163

(56) References Cited

U.S. PATENT DOCUMENTS

| | | | |
|---|---|---|---|
| 4,737,731 A | | 4/1988 | Swanson et al. |
| 5,559,467 A | | 9/1996 | Smedley |
| 5,617,058 A | | 4/1997 | Adrian et al. |
| 5,777,512 A | | 7/1998 | Tripathi et al. |
| 6,160,506 A | * | 12/2000 | Pellon ........................ 341/143 |
| 6,266,002 B1 | * | 7/2001 | Gong ........................ 341/150 |

OTHER PUBLICATIONS

European Patent Application No. 92104108.3, Publication No. 0 503 571 A1. Applicant: Matsushita Electric Industrial Co., Ltd. Title: Pulse–width Moculation Amplifier. Filing Date: Oct. 03, 1992.

PCT Application No. PCT/GB97/03017, Publication No. WO 98/20608. Applicant: Harman International Industries Limited. Title: Improvements in or Relating to Amplifiers. Filing Date: Jun. 11, 1997.

\* cited by examiner

Primary Examiner—Brian Young
(74) Attorney, Agent, or Firm—Jennifer L. Bales, Macheledt Bales LLP

(57) ABSTRACT

The digital amplifier of the present invention comprises a delta sigma noise shaper feeding a pulse wave modulator (PWM) which drives a load such as a speaker. The amplifier includes circuitry to measure the voltage coming out of the power supply in the circuit, and using this measurement as a control signal to modify the feedback path and direct path of the noise shaper, in order to correct the pulse width output to compensate for the varying power supply voltages. The amplifier may also include circuitry to correct for the nonlinear effects of pulse wave modulation, by correcting the feedback applied to one stage of the noise shaper such that it is nontrivially different from the feedback applied to another stage.

19 Claims, 3 Drawing Sheets

POWER SUPPLY COMPENSATION FOR NOISE SHAPED, DIGITAL AMPLIFIERS

This application claims the benefit of U.S. Provisional Application No. 60/124,584, filed Mar. 16, 1999.

BACKGROUND OF THE INVENTION

1. Field of the Invention

The present invention relates to the field of noise shaped digital amplifiers which directly convert digital signals to a power output. More specifically, the present invention relates to such digital amplifiers which are powered by power supplies having ripple and noise, and which include circuitry to compensate for the power supply voltage variations.

2. Description of Prior Art

Delta sigma modulation has become the standard technique for converting audio signals from the digital domain to the analog domain. For a good overview of the art, "Delta Sigma Data Converters, by Norsworthy, Schreier and Temes (IEEE Press, 1997) is recommended. There is increasing interest in the use of noise shaping directly in power amplification to produce digital amplifiers. Very often this is accomplished by the combination of a delta sigma noise shaping element with a pulse width modulator, or PWM. For an overview of this technology, see U.S. Pat. Nos. 5,784,017 and 5,548,286 by Craven, U.S. Pat. No. 5,815,102 by the present inventor (incorporated herein by reference), U.S. patent application Ser. No. 09/163,235 by the present inventor (incorporated herein by reference), and International Patent Application No. PCT/DK97/00133 by Risbo. One of the significant difficulties in the production of such a system is the need for a well regulated power supply (or supplies). A potential solution to this problem is identified in U.S. Pat. No. 5,559,467, by Smedly. Smedly correctly identifies the need to use the value of the power supply voltage to modify the operation of the modulation, but proposes a solution that creates its own distortion. In addition, in the case of more that one power supply, it is necessary to use the value of both supplies in calculating the proper output.

With regard to the Smedly design, the first source of distortion is the memory, or state, in the noise shaping converter. The value of these state variables is referenced to the prior supply voltage, but the feedback will be used to modulate a future voltage. The noise cancellation which normally occurs cannot properly be canceled, as would happen in the normal, theoretic noise shaping case. In addition, referring to FIG. 5 of Smedly, the voltage across capacitor 36 is not the same as that across capacitor 38. This will induce other kinds of distortion. This second type of distortion would not occur in a four switch full bridge configuration, but would be significant in the structure drawn in FIG. 5.

A need remains in the art for a digital amplifier that properly compensates for the lack of regulation in its power supplies, without introducing any new sources of distortion.

SUMMARY OF INVENTION

It is an object of the present invention to provide a digital amplifier that properly compensates for the lack of regulation in its power supplies, without introducing any new sources of distortion.

As used herein, the term "digital amplifier" applies to an amplifier which directly converts to a power output. The digital amplifier of the present invention comprises a delta sigma noise shaper feeding a pulse wave modulator (PWM) which drives a load such as a speaker. The delta sigma converter includes circuitry to correct for the nonlinear effects of pulse wave modulation. The delta sigma converter further includes circuitry to use a digital representation of the voltage coming out of the power supplies in the circuit to correct the pulse width output to compensate for the varying power supply voltages.

A digital amplifier according to the present invention comprises a delta sigma modulator having a direct signal path and a feedback signal path, with the audio signal as its input, and supplying a noise shaped signal as its output, and an output stage for converting the noise shaped signal into a power output. The output stage includes a power supply for supplying at least one level of voltage and power output circuitry powered by the power supply for generating a digital output signal according to the noise shaped signal. Compensating circuitry for correcting for variations in the voltage level supplied by the power supply includes means for measuring the voltage level of the power supply and means for adjusting the delta sigma modulator feedback by applying a function to the feedback according to the measured output voltage.

In the preferred embodiment, the compensating circuitry also modifies the direct path of the delta sigma modulator by applying a function which is substantially the inverse of the function applied by the feedback adjusting means. The direct path may be modified by applying a constant scalar to the direct path, or by continuously modifying the direct path according to the inverse of the effective output voltage.

The digital amplifier output stage preferably includes a pulse wave modulator for converting the noise shaped signal into a signal having various pulse widths related to the level of the noise shaped signal. Alternatively, the output stage could use a class D stage.

Generally, the power supply block supplies two levels of voltage, the voltage measuring means measures the two levels of voltage, and the compensating circuitry adjusts the feedback path and modifies the direct path according to the measured voltages.

As a feature, where the delta sigma modulator includes at least two integrator stages, the feedback applied to one stage is nontrivially different from the feedback applied to another stage, in order to correct for distortion introduced after the noise shaper.

The invention is an improvement in digital to analog conversion where the conversion is noise shaped, and the final output is created by switches connected to an unregulated power supply. No division circuit is utilized in the input signal path, as this would cause the above mentioned distortion. Instead, the operation of the noise shaper is modified to correctly reflect the output values being represented. Specifically, the quantizer and its feedback must be modified. In addition, two analog to converters (ADCs) are used in the case of two power supplies.

DETAILED DESCRIPTION OF THE PREFERRED EMBODIMENTS

Figure 1:
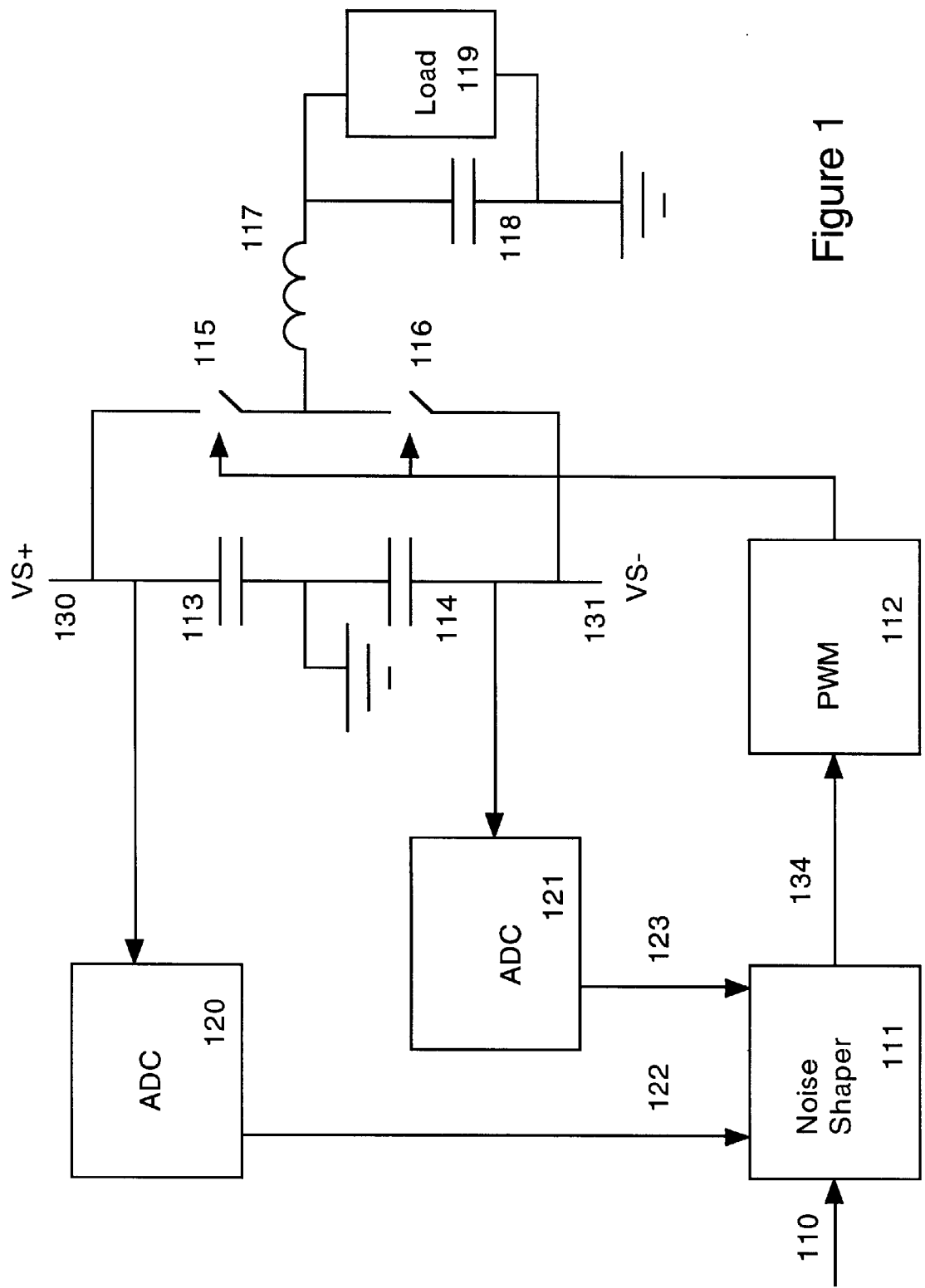
FIG. 1 is a block diagram showing the power supply distortion compensation circuitry of the present invention, applied to the noise shaping stage of the modulator.

FIG. 1 shows a block diagram of the preferred embodiment of the present invention. Input signal 110 is noise shaped in a delta sigma fashion by noise shaper 111. Pulse width modulator 112 converts the output of the noise shaper into a one bit stream which is used to control switches 115 and 116. An output filter, comprising inductor 117 and capacitor 118, removes the high frequency energy from the signal, and the desired audio signal is applied to load 119, often a loudspeaker. Two power supplies 130 and 131 provide the voltage and current for the load. In general these power supplies, providing voltages VS+ and VS−, are not regulated, and their voltages can vary with time. A/D converters (ADCS) 120 and 121 generate digital signals 122 and 123 based on the voltages of the corresponding power supplies. Signals 122 and 123 are used by noise shaper 111 to correct the pulse width properly for the desired output signal (see FIGS. 2 and 3).

Figure 3:
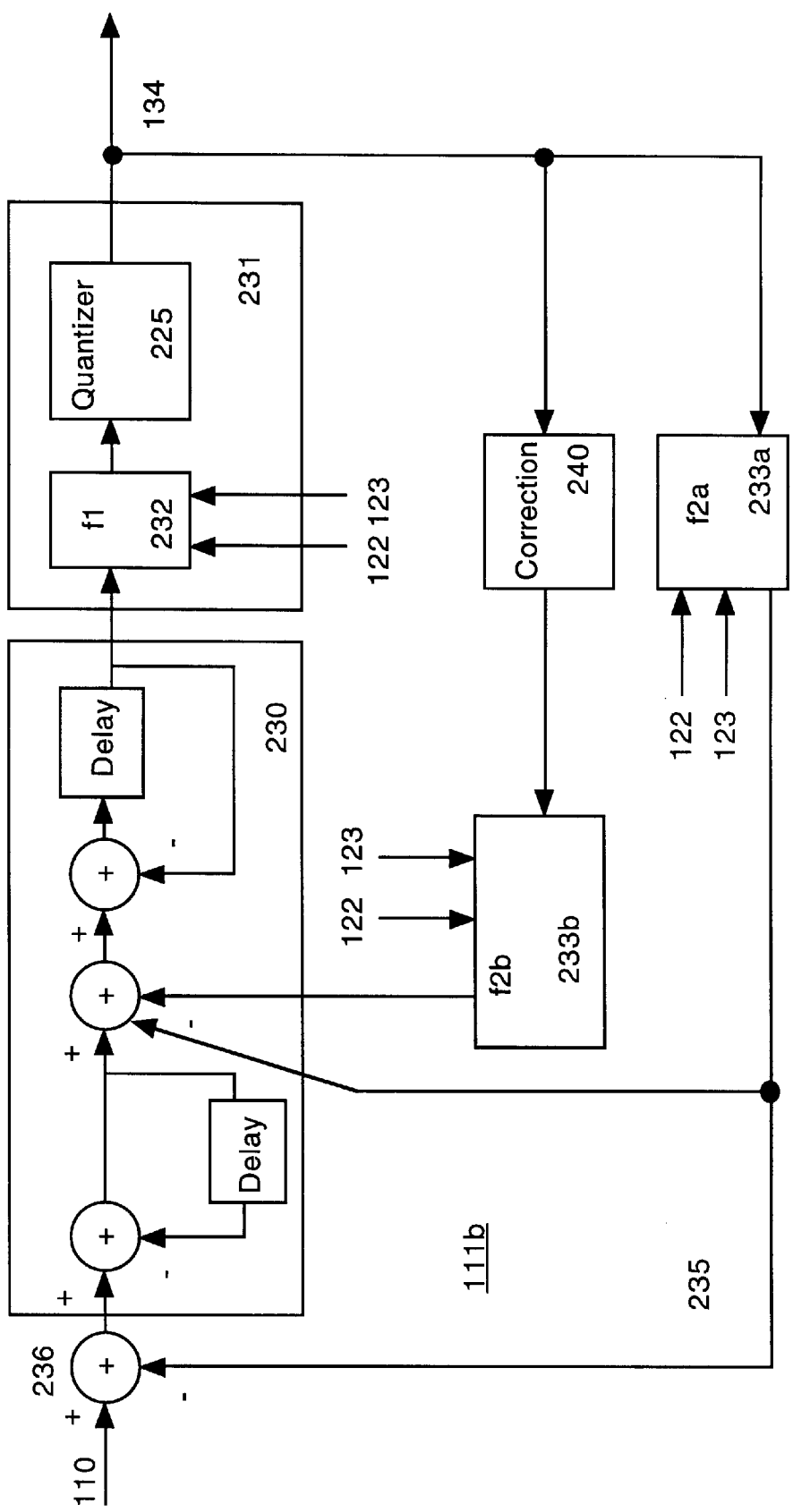
FIG. 3 is a block diagram showing a second embodiment of the compensated noise shaper of FIG. 1 in more detail.

Noise shaper 111 is preferably of the type that compensates for the effects of pulse width modulation, as described in Melanson 5,815,102, 09/163,235, and 09/510,034. One example of such a delta sigma noise shaper is shown in FIG. 3, and others are described in the above patents. The output switching here uses 2 power supplies 130, 131, but could operate as well in a full bridge mode with only one supply, or in a capacitor coupled output with only one supply. In these cases, the voltage read by ADC 121 is assumed to be 0, and ADC 121 can be removed. There are also configurations that would be used in motor drive, such as those containing three sets of output switches, for three phase control. It also may be useful to have more than two power supplies for some applications. The basic techniques shown here can be applied to those cases as well by one skilled in the art. In addition, noise shaping may be used with a simple single bit output by not including PWM stage 112. The techniques shown here can be applied equally to that case by simply assuming that the only available pulse widths are 0% and 100%.

Figure 2:
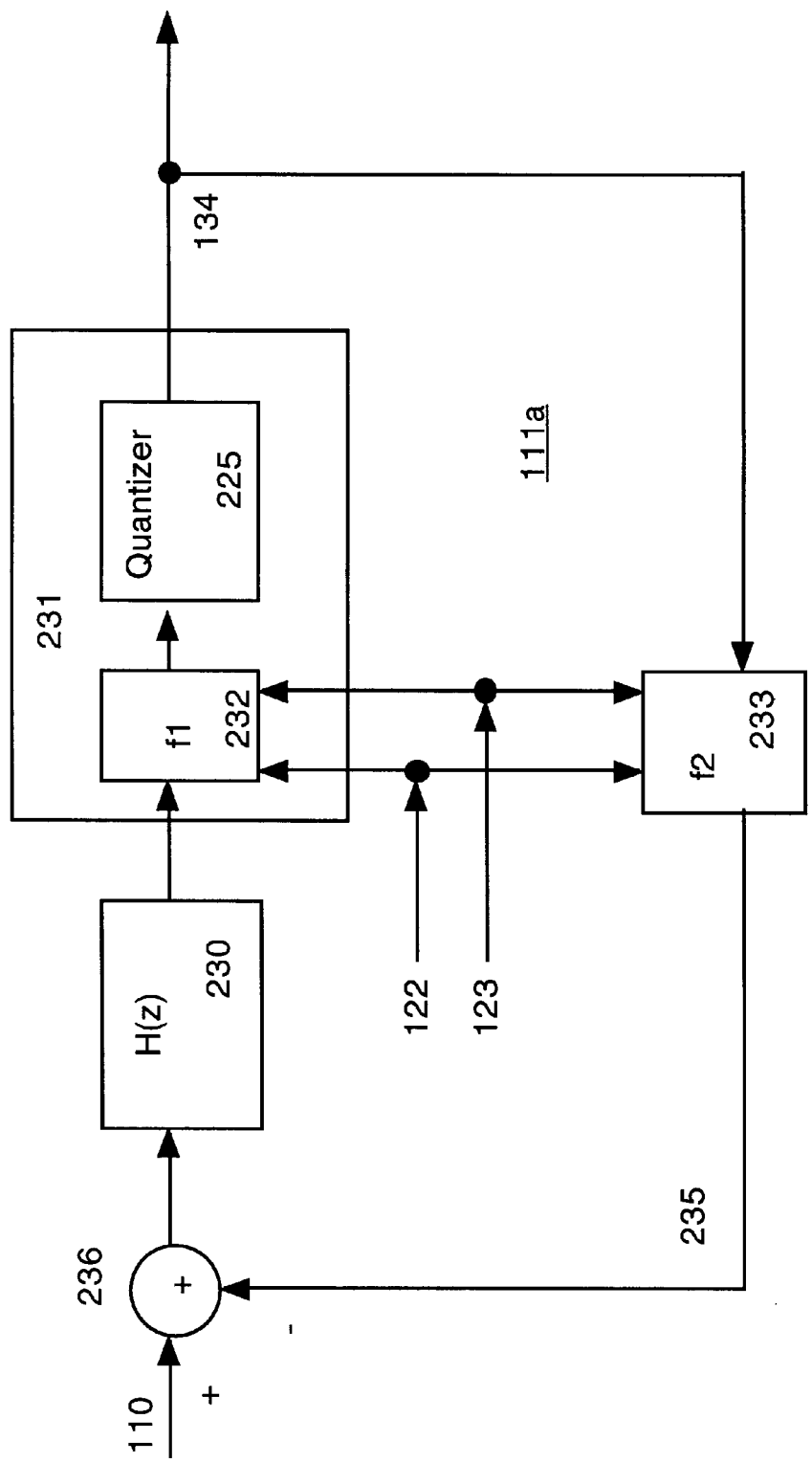
FIG. 2 is a block diagram showing a first embodiment of the compensated noise shaper of FIG. 1 in more detail.

FIG. 2 is a block diagram showing the details of noise shaper 111, which feeds PWM 112. The input signal 110 is added to the feedback signal 235, and fed to filter block 230. Filter 230 is a conventional noise shaping delta sigma modulator. Blocks f1 (232) and f2 (233) compensate for the actual voltages provided by power supplies 130, 131, via control signals 122 and 123 (representing the power supply voltages).

Quantizer 225 selects a pulse width, W, from 0 to N, where N is the number of time slots available in the PWM stage 112 (see FIG. 1). Signal W is the output signal 134, which is fed to PWM 112 (if used).

Functions f1 and f2 compensate for voltage supply values as follows. Referring back to FIG. 1, the signal out of PWM stage 112 is high, or at a value of (VS+), for W/N fraction of the time. It is low, or at a value of (VS−), for (N−W)/N fraction of the time. It is assumed that the value (VS−) nominally has a negative sign. The effective output voltage is therefore:

$$VOUT=(VS+)*W/N+(VS-)*(N-W)/N=((VS+)-(VS-))*W/N+(VS-)$$

If the numeric values into the system are assumed to be in units of volts, the above value is the proper feedback. In general, this is not the case, and a numeric value of full scale corresponds to, for example, 12 volts. If ADCs 120, 121 reading the voltages VS+ and VS− are scaled according to the same rules, and we call those numeric values v1 and v2, the value that f2, implemented in block 233, creates for linear feedback 235 is $$f2=(v1-v2)*W/N+v2$$

Note that N is a constant, so that no actual divisions are necessary, and that only multiplication and addition must be performed in real time. The nonlinear terms, if used, are corrected in the same way, and in general are simply multiplied by (v1−v2). If some other kind of scaling is used on the converters, similar math will produce the proper feedback values.

What remains is the design of quantizer block 231, comprising f1 block 232 and quantizer 225. It is the proper function of block 231, given input x, to find the desired pulse width W such that the feedback (v1−v2)*W/N+v2 is as close as possible to x, with the constraint that W must be an integer. This is true when $$f1=(x-v2)*N/(v1-v2)$$

before quantization; and $$W=\text{floor}((x-v2)*N/(v1-v2)+0.5)$$

after quantization
where the mathematical function floor (x) is defined as the greatest integer value less than or equal to x (also known as truncation). f1 is the function applied by block 232, and W is signal 134 out of block 231.

The function of block 231, implemented by f1 (block 232) combined with quantizer 225, requires a divide. While the feedback must be performed at high accuracy, there is minimal loss of performance if the quantizer output 134 is approximate. Simple polynomials, using only multiplication, can be used to approximate the division. In the Smedly case, the division accuracy is critical, as it is in the signal path. Here the only division operation can be simply approximated.

For e small, 1/(1+e) can be approximated by:

1−e

1−e+e^2

1−e+e^2−e^3 and so on, with increasing accuracy. Similarly, by substitution, for y close to 1, 1/y can be approximated by:

2−y

3−3*y+y^2

4−6*y+4*y^2−y^3

In the final case, a 25% deviation in y (equivalent to a +−25% power supply variation) has in inverse error of less than 0.5%. This would be adequate for a 256 level quantizer with realistic power supplies. For greater supply ranges, other inverse approximations can be used, such as Chebychev polynomials. Such techniques are well known to one versed in the art of numeric approximations. As a multiplier is a normal element in a signal processing environment, and a divider is not, the use of such an approximation is key. An approximate inverse can also be made with a table lookup. If the nominal value of v1−v2 is not one, the inverse can be found using these approximations by proper scaling, the basic functions being unchanged.

Now we have the function of 231 stated as $$W=\text{floor}((x-v2)*N*INVV+0.5),$$

where INVV=f(v1−v2) and f ( ) defined as an inverse function, approximation being acceptable.

With these modifications, the described loop will compensate properly for variations in one or more power supplies.

Finally, since an accurate function f2 in the feedback is so much more important that an accurate function f1 in the direct path, f1 can be a constant gain which approximates the inverse of f2. f2 is still measured.

FIG. 3 is a block diagram showing a second embodiment 111b of the compensated noise shaper 111 of FIG. 1. Filter 230, in this example, includes two integrator stages, forming a two stage delta sigma modulator 111b. Each integrator stage adds feedback signal 134 to the direct signal in the conventional manner. But, as taught in Melanson 5, at least one of the stages is corrected such that it receives a total feedback signal which is nontrivially different from the feedback signal applied to another of the stages. The correction term 240 is selected to compensate for distortion introduced by nonlinearities in stages which occur after noise shaper 111 (e.g. PWM 112, or a power output stage). The two blocks implementing f2 (233a and 233b) generally implement the same function, but one of these could be tweaked for better performance.

It will be appreciated by one versed in the art that there are many possible variations on these designs, but all are typified by the correction for supply variations in the feedback path.

What is claimed is:

1. A digital amplifier for converting a digital audio signal to a power output comprising:
   a delta sigma modulator having a direct signal path and a feedback signal path, with the audio signal as its input, and supplying a noise shaped signal as its output; and
   an output stage for converting the noise shaped signal into a power output, the output stage including
      a power supply for supplying at least one level of voltage, and
      power output circuitry powered by the power supply for generating a digital output signal according to the noise shaped signal;
   further including compensating circuitry for correcting for variations in the voltage level supplied by the power supply, the compensating circuitry including
      means for measuring the voltage level of the power supply, and
      means for adjusting the delta sigma modulator feedback by applying a function to the feedback according to the measured output voltage.

2. The digital amplifier of claim 1, wherein the compensating circuitry further comprises means for modifying the direct path of the delta sigma modulator, wherein the direct path modifying means applies a function which is substantially the inverse of the function applied by the feedback adjusting means.

3. The digital amplifier of claim 2, wherein the direct path modifying means applies a constant scalar to the direct path.

4. The digital amplifier of claim 2, wherein the direct path modifying means continuously modifies the direct path according to the inverse of the effective output voltage.

5. The digital amplifier of claim 2, wherein the output stage includes a pulse wave modulator for converting the noise shaped signal into a signal having various pulse widths related to the level of the noise shaped signal.

6. The digital amplifier of claim 2, wherein the output stage includes a class D stage.

7. The digital amplified r of claim 2, wherein the power supply block supplies two levels of voltage, wherein the voltage measuring means measures the two levels of voltage, and wherein the compensating circuitry adjusts the feedback path and modifies the direct path according to the measured voltages.

8. The digital amplifier of claim 2, wherein the delta sigma modulator includes at least two integrator stages, and wherein the feedback applied to one stage is nontrivially different from the feedback applied to another stage.

9. The digital amplifier of claim 1, wherein the output stage includes a pulse wave modulator for converting the noise shaped signal into a signal having various pulse widths related to the level of the noise shaped signal.

10. The digital amplifier of claim 1, wherein the output stage includes a class D stage.

11. The digital amplifier of claim 1, wherein the power supply block supplies two levels of voltage, wherein the voltage measuring means measures the two levels of voltage, and wherein the compensating circuitry adjusts the feedback path and modifies the direct path according to the measured voltages.

12. The digital amplifier of claim 1, wherein the delta sigma modulator includes at least two integrator stages, and wherein the feedback applied to one stage is nontrivially different from the feedback applied to another stage.

13. In a digital amplifier having a noise shaping filter and a power output stage, the method of compensating the output of the noise shaping filter for variations in the power supply of the output stage comprising the steps of:
   measuring the voltage of the power supply; and
   compensating the feedback path of the noise shaper according to the measured voltage.

14. The method of claim 13, further including the step of:
   compensating the direct path of the noise shaper according to the measured voltage.

15. The method of claim 14, wherein the direct path compensating step applies a constant scalar to the direct path.

16. The method of claim 14, wherein the direct path compensating step continuously modifies the direct path according to the inverse of the effective output voltage.

17. The method of claim 14, further including the step of converting the noise shaped signal into a signal having various pulse widths related to the level of the noise shaped signal.

18. The method of claim 14, wherein the power supply block supplies two levels of voltage, wherein the voltage measuring step measures the two levels of voltage, and wherein the compensating step compensates the feedback path the direct path according to the measured voltages.

19. The method of claim 14, wherein the delta sigma modulator includes at least two integrator stages, and further including the step of correcting the feedback applied to one stage such that it is nontrivially different from the feedback applied to another stage.

* * * * *